United States Patent
Shepela et al.

[11] Patent Number: 6,060,387
[45] Date of Patent: May 9, 2000

[54] TRANSISTOR FABRICATION PROCESS IN WHICH A CONTACT METALLIZATION IS FORMED WITH DIFFERENT SILICIDE THICKNESS OVER GATE INTERCONNECT MATERIAL AND TRANSISTOR SOURCE/DRAIN REGIONS

[75] Inventors: Adam Shepela, Bolton; Gregory J. Grula, Charlton; Bjorn Zetterlund, Marlborough, all of Mass.

[73] Assignee: Compaq Computer Corporation, Houston, Tex.

[21] Appl. No.: 08/574,557

[22] Filed: Nov. 20, 1995

[51] Int. Cl.$^7$ ................................. H01L 21/4763
[52] U.S. Cl. .................. 438/630; 438/626; 438/631; 438/648; 438/649; 438/651; 438/655; 438/664; 438/682; 438/685; 438/691; 438/721
[58] Field of Search .................. 437/200; 438/586, 438/202, 233, 275, 279, 626, 631, 633, 634, 647, 624, 637, 630, 648, 649, 651, 655, 664, 682, 685, 691, 721

[56] References Cited

U.S. PATENT DOCUMENTS

| | | | |
|---|---|---|---|
| 4,851,257 | 7/1989 | Young et al. | 427/96 |
| 4,908,332 | 3/1990 | Wu | 438/647 |
| 5,219,784 | 6/1993 | Solheim | 437/57 |
| 5,714,394 | 2/1998 | Kadosh et al. | 437/21 |
| 5,851,916 | 12/1998 | Howard | 438/626 |

OTHER PUBLICATIONS

"Silicon Contact Formation and Photoresist Planarization Using Chemical Mechanical Polishing," Craig L. Keast, et al., VMIC Conference, Jun. 7–8, 1994.

*Primary Examiner*—David Nelms
*Assistant Examiner*—Reneé R. Berry
*Attorney, Agent, or Firm*—Sharp, Comfort & Merrett, P.C.

[57] ABSTRACT

A new process for creating a transistor in an integrated circuit provides for two suicide formations, each independent of the other, from two metal depositions and formations steps. The process produces a sufficiently low resistance silicide layer over the source/drain region surfaces of the transistor while also creating a lower resistance silicide over the gate interconnects. In an example embodiment of the invention a near-planar isolation process is used applied such that the gate interconnect surfaces are co-planar. A first silicide layer is formed over the source/drain regions. A dielectric gap-fill material is applied. A planarization method such as chemical mechanical polishing is used to remove the gap fill material down to the top surface of the gate interconnect. A relatively thick suicide is then formed over the top surface of the gate interconnect.

23 Claims, 3 Drawing Sheets

TRANSISTOR FABRICATION PROCESS IN WHICH A CONTACT METALLIZATION IS FORMED WITH DIFFERENT SILICIDE THICKNESS OVER GATE INTERCONNECT MATERIAL AND TRANSISTOR SOURCE/DRAIN REGIONS

FIELD OF THE INVENTION

The invention relates generally to design and fabrication of integrated circuits, and specifically to a process for forming silicide layers of different thicknesses over the source drain areas and the poly-silicon gate interconnect areas in an integrated circuit.

BACKGROUND

In order to increase the gate density and operating speed of integrated circuits, the feature size of transistors within the circuit must decrease. In conventional fabrication processes the creation of source/drain regions by diffusion results in some amount of lateral diffusion beneath the gate region. The amount of lateral diffusion under the gate area can be limited to some extent by use of oxide spacers. However the lateral diffusion must also generally be limited by controlling the depth of the source/drain regions. Thus typically the smaller feature size used to provide higher densities and speeds in integrated circuits requires increasingly shallow source/drain regions.

A further requirement in integrated circuit production is creation of good ohmic contacts on the source/drain regions. This may be accomplished through formation of a silicide layer on the source/drain region surfaces. In addition, the sheet resistance of the gate interconnect surfaces must be lowered to reduce RC delay across the transistor gate in high frequency circuits. This also is accomplished by formation of a silicide layer over the top surface of the gate interconnects.

Existing processes meet the above requirements through a deposition-formation step in which a single silicide layer, having a uniform thickness, is simultaneously formed on both the surfaces of the source/drain regions and the top surface of the gate interconnects. During this process, some amount of silicide forms downward and laterally through the source/drain regions. Where these source/drain regions are very shallow, and the silicide thickness is sufficiently large, the silicide may penetrate substantially or completely through the source/drain regions. Substantial penetration may result in excessive junction leakage during operation causing the device to fail.

In order to limit such junction leakage, the amount of metal deposited to form the silicide layer may be reduced, consequently reducing the amount of silicide formed. However such thinner silicide may be inadequate to meet the sheet resistance requirements of the gate interconnects. Such high sheet resistance will increase RC delay across the transistor gate thereby reducing high frequency circuit performance.

Thus it is seen that existing processes are ineffective in providing the appropriate thicknesses of silicide over both the source/drain region and gate interconnect surfaces. Therefore, a new integrated circuit fabrication process is required which allows for a sufficiently thick silicide layer over the gate interconnect areas without requiring an excessively thick silicide over the source/drain regions.

SUMMARY OF THE INVENTION

In accordance with principles of the invention there is disclosed a new process for creating a transistor in an integrated circuit. In the disclosed process a gate interconnect and source and drain regions are formed. A first silicide layer is provided on a surface of the source and drain regions. A layer of gap filling material having a thickness greater than the height of the gate interconnect is deposited. The gap filling material is planarized down to expose a top surface of the gate interconnect. A second relatively thick silicide layer is provided on the top surface of the gate interconnect. In a first example embodiment of the invention a near-planar isolation process is used such that the gate interconnect surfaces are formed having top surfaces that are substantially co-planar.

The disclosed process provides a sufficiently low resistance silicide layer over the source/drain regions while also creating a lower resistance, relatively thicker silicide over the gate interconnect material. The disclosed process provides sufficiently low sheet resistance in the gate interconnect without causing silicide to penetrate substantially or completely through the source/drain regions.

BRIEF DESCRIPTION OF THE DRAWINGS

The foregoing features and other aspects of the invention will now become apparent when the accompanying description is read in conjunction with the following drawings in which.

DETAILED DESCRIPTION OF THE PREFERRED EMBODIMENTS

Figure 1:
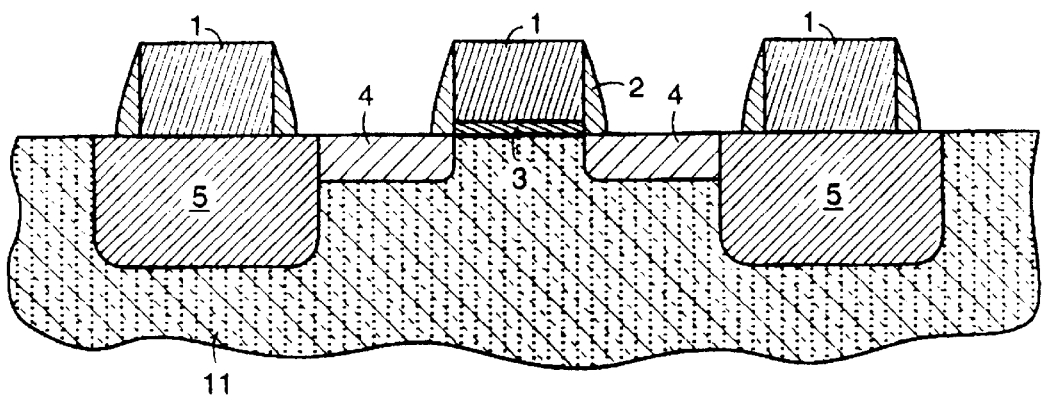
FIG. 1 shows a cross section view of a transistor during fabrication having a gate interconnect and other regions.

FIG. 1 shows a cross section view of a transistor in the process of fabrication having a patterned gate interconnect 1 and other regions. Example gate interconnect materials include polysilicon or amorphous silicon. The transistor in FIG. 1 further includes source/drain regions 4 (for example n+type silicon), a substrate 11 (of an opposite type, for example p-type silicon), spacers 2 (of for example silicon dioxide or silicon nitride), gate oxide 3, and field isolation regions 5. For purposes of example the gate interconnect 1 has a thickness of between 3500 and 2200 Angstroms, the spacers 2 have a width of between 800 and 1200 Angstroms, the gate oxide 3 has a thickness between 65 and 97 Angstroms, the source/drain regions 4 have a thickness of between 0.20 and 0.15 microns, and the field isolation regions 5 have a thickness of between 3300 and 3900 Angstroms. Thus FIG. 1 shows a transistor during fabrication at a point in the process where the source/drain regions have been formed and the surfaces of the source drain regions as well as the gate interconnect surfaces are oxide free.

Figure 2:
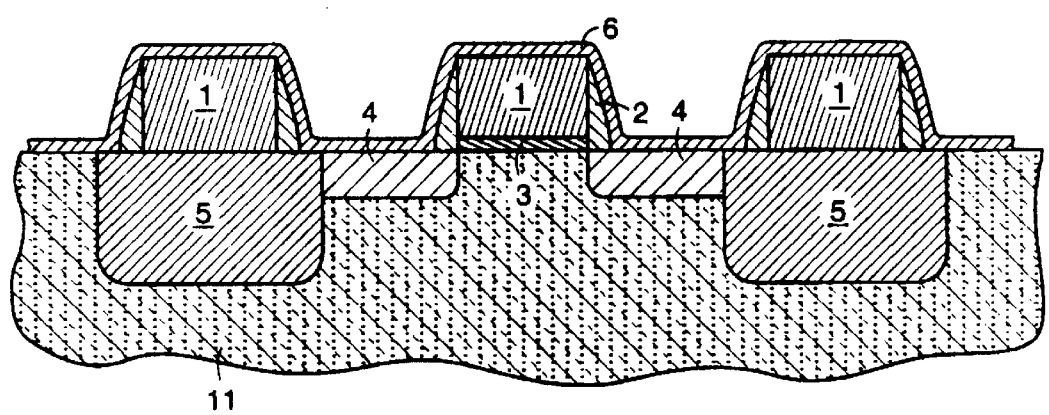
FIG. 2 shows the cross section view of the transistor including a first silicide forming metal layer.

FIG. 2 shows a cross section of the transistor of FIG. 1 having a silicide forming metal layer 6 deposited over the surfaces as shown in FIG. 1. The deposition of the metal layer 6 shown in FIG. 2 may be accomplished for example through a sputtering technique. Other deposition methods which provide for application of a metal layer having a controlled thickness may be used, including metal organic chemical vapor deposition, evaporation, or electroplating. The silicide forming metal may be, for example palladium (Pd), platinum (Pt), nickel (Ni), cobalt (Co), titanium (Ti) or tungsten (W). For purposes of example, the metal layer 6 is a layer of cobalt having thickness of 120–200 Angstroms including a capping layer of titanium nitride having a thickness of 80 Angstroms. The metal layer 6 is deposited over the entire wafer surface and silicide is formed where the source/drain regions and gate interconnect surfaces are oxide free as shown in FIG. 1.

The structure shown in FIG. 2 is heated in an inert ambient. In an example embodiment, the device of FIG. 2 is heated in a rapid thermal annealing chamber at 440 degrees Centigrade for 90 seconds in a nitrogen ambient. The unreacted metal over the oxide surfaces 5 and 2 is removed in an acid solution which does not attack the silicide layer. For example a selective wet chemical etch is first used to remove only the TiN capping layer and the unreacted cobalt. The example etchant is a solution of nitric acid, acetic acid, phosphoric acid and hydrogen peroxide. Further in the example embodiment a second rapid thermal anneal at 700 degrees Centigrade for 60 seconds in nitrogen is next performed in order to transform the resulting silicide layer (element 7 shown in FIG. 3) from cobalt silicide (CoSi) to cobalt disilicide ($CoSi_2$) in order to further reduce the resistance of the resulting silicide layer.

Figure 3:
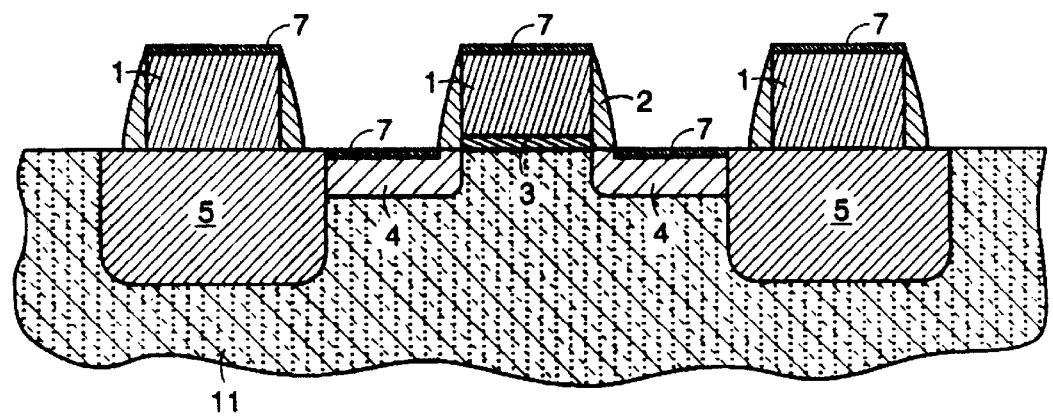
FIG. 3 shows the transistor cross section including a first silicide layer.

FIG. 3 shows the transistor cross section having a first silicide layer 7 formed on the top surface of the gate interconnect and source/drain regions. The thickness of the resulting cobalt silicide layer 7 in the example embodiment is between 400 and 700 Angstroms.

Figure 4:
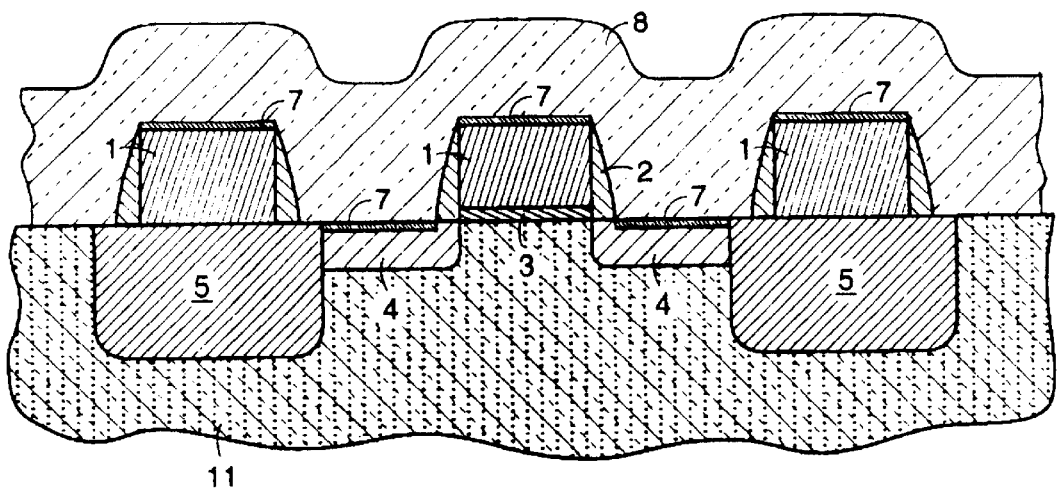
FIG. 4 shows the transistor cross section having a layer of dielectric gap fill material.

A gap fill material, for example a dielectric material such as silicon dioxide, which may be doped with a few weight percent of phosphorous, is deposited over the top surface of the structure as shown in FIG. 4. FIG. 4 shows a gap fill layer 8, deposited over all surfaces of the structure. An example thickness of the gap fill layer 8 is 5000 to 7000 Angstroms. The gap fill layer 8 may be formed for example using a plasma enhanced chemical vapor deposition.

Figure 5:
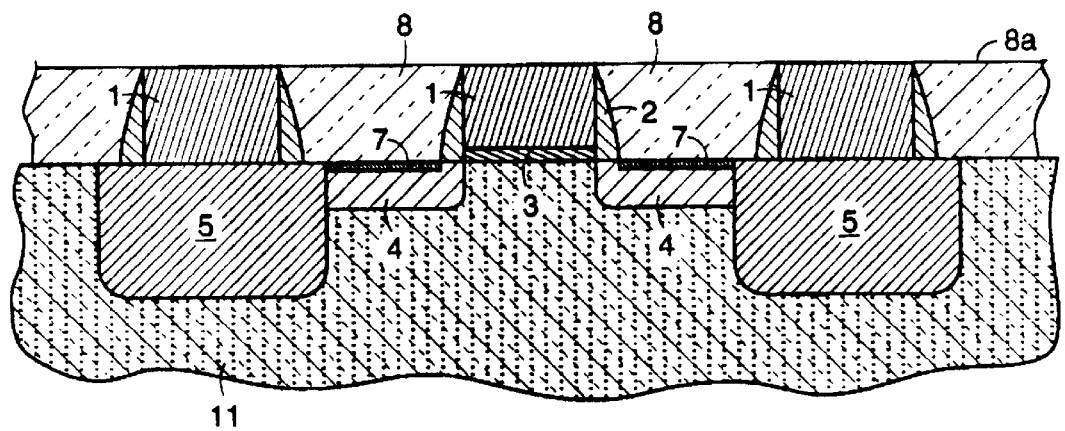
FIG. 5 shows the transistor cross section following planarization of the gap fill material down to the top surface of the gate interconnect.

A planar surface is formed by removing the gap fill layer 8 down to the top surface of the gate interconnect 1. In an example embodiment chemical-mechanical polishing is used to create a planar surface in which the top surface of the gate interconnect is exposed. The result of the chemical-mechanical polishing is a planar surface 8a shown in FIG. 5, including the exposed top surface of the gate interconnect 1. FIG. 5 shows the gap fill layer 8, polished to expose the gate interconnect 1 top surface.

Figure 6:
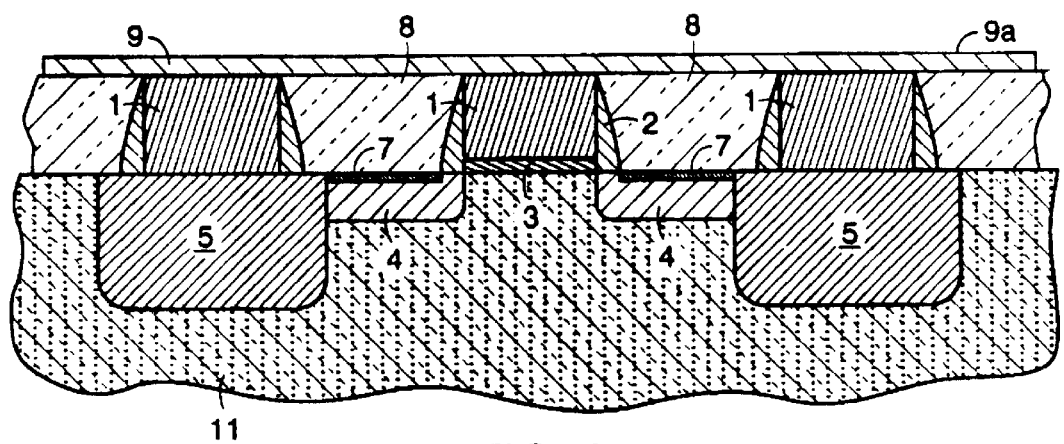
FIG. 6 shows a transistor cross section including a second silicide forming metal layer.

A second silicide-forming metal film such as palladium (Pd), platinum (Pt), nickel (Ni), cobalt (Co), tungsten (W) or titanium (Ti) is deposited over the planar surface 8a of the structure using for example sputter deposition, evaporation deposition, electroplating or electroless deposition. FIG. 6 shows a silicide-forming metal layer 9, deposited over the planer surface 8a. For example the silicide-forming metal layer 9 is cobalt having a thickness of between 200and 350 Angstroms. Further in the example embodiment of FIG. 6, a capping layer of titanium nitride film 9a, having an example thickness of approximately 80 Angstroms, is deposited over the silicide-forming metal layer 9. The thickness of the silicide forming metal layer 9 is selected to provide a suricide layer of sufficient thickness to lower the sheet resistance of the gate interconnects to an acceptable sheet resistance, for example between 2 and 8 ohms per square unit.

The structure is heated in an inert ambient causing silicide to form selectively on the top surface of the gate interconnect. In an example embodiment the device is heated in a rapid thermal annealing chamber at 440 degrees Centigrade for 90 seconds in a nitrogen ambient. The unreacted metal over the gap fill material is removed in an acid solution that does not attack the silicide. For example a selective wet chemical etch is first used to remove the TiN capping layer and the unreacted cobalt. An example etchant is a solution of nitric acid, acetic acid, phosphoric acid and hydrogen peroxide. Further in the example embodiment a second rapid thermal anneal at 700 degrees Centigrade for 60 seconds in nitrogen is performed in order to transform the resulting silicide layer (element 10 shown in FIG. 7) from cobalt silicide (CoSi) to cobalt disilicide ($CoSi_2$) in order to further reduce the sheet resistance of the resulting silicide layer.

Figure 7:
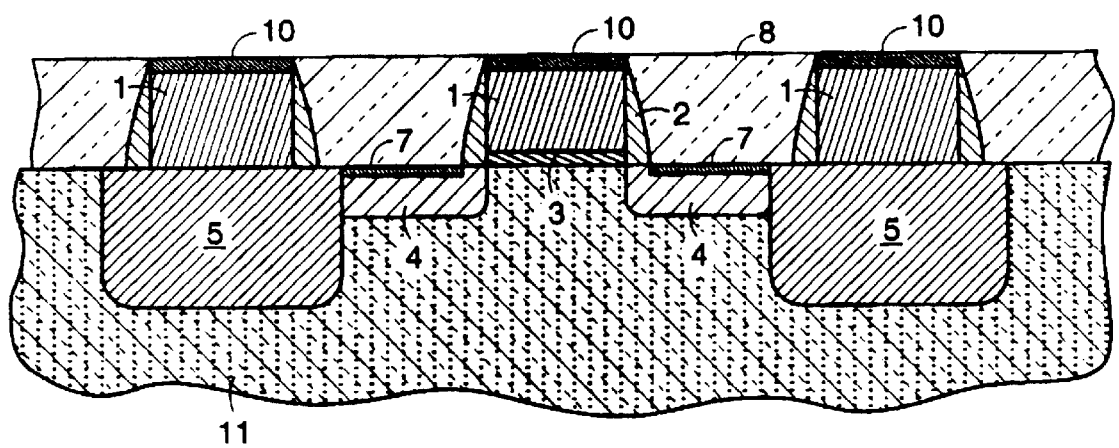
FIG. 7 shows a transistor cross section including a second silicide.

FIG. 7 shows the relatively thick silicide layer 10 formed only on the exposed top surface of the gate interconnect 1. In the example embodiment of FIG. 7 the silicide layer 10 has a thickness of between 700 and 1225 Angstroms. Conventional methods are used to complete fabrication of the transistor and the entire integrated circuit. In this way, the process of the invention achieves both low leakage transistor junctions with a thin silicide layer to provide a good ohmic contact, as well as a sufficiently low sheet resistance silicided gate interconnect.

Through the above steps the invention provides a silicide on the source/drain region surfaces that is sufficiently thin such that the silicide interface does not excessively penetrate the source/drain regions and result in excessive junction leakage or shorts. The invention simultaneously provides a silicide on the top surface of the gate interconnect having sufficient thickness to produce acceptable sheet resistance for the gate interconnect.

While the present invention has been described in conjunction with its preferred embodiments, this description is not intended in a limiting sense. It will be apparent to one of ordinary skill in the art that the disclosed invention is generally applicable to the area of transistor fabrication in a variety of specific implementations or embodiments.

We claim:

1. A method of forming an integrated circuit device on a silicon substrate comprising the steps of:

forming a gate interconnect and source and drain regions in said silicon substrate on opposite sides of said gate interconnect;

providing a first silicide layer over a surface of said source and drain regions;

depositing a layer of gap filling dielectric material having a thickness greater than the height of said gate interconnect;

planarizing said gap filling dielectric material to expose a top surface of said gate interconnect; and providing a second silicide layer on said top surface of said gate interconnect.

2. The method as in claim 1, wherein said planarization is accomplished through chemical mechanical polishing.

3. The method as in claim 1, wherein said step of providing said first silicide layer includes depositing a layer of a first silicide forming metal.

4. The method as in claim 3, wherein said first silicide forming metal is one of palladium, platinum, nickel, cobalt, titanium or tungsten.

5. The method as in claim 3, wherein said first silicide forming metal has a thickness less than or equal to 200 Angstroms.

6. The method as in claim 3, wherein said first silicide forming metal is deposited using a sputter deposition technique.

7. The method as in claim 1 wherein said step of providing said second silicide layer includes depositing a layer of a second silicide forming metal.

8. The method as in claim 7, wherein said second silicide forming metal is one of palladium, platinum, nickel, cobalt, titanium or tungsten.

9. The method as in claim 7, wherein said second silicide forming metal has a thickness greater than or equal to 200 Angstroms.

10. The method as in claim 7, wherein said second silicide forming metal is deposited using a sputter deposition technique.

11. The method as in claim 1, wherein said gate interconnect has a thickness range of 2200 and 3500 Angstroms.

12. The method as in claim 1, wherein said gap filling dielectric material has a thickness of between 5000 and 7000 Angstroms.

13. A method of forming a semiconductor device, the method comprising:
   forming first and second source/drain regions in a silicon region, the first and second source/drain regions being separated by a channel region;
   forming a silicon gate overlying the channel region and insulated therefrom;
   forming a layer of siliciding metal over the device;
   reacting the layer of siliciding metal with the first and source/drain regions and the gate to form silicide regions on the first and second source/drain regions and the gate;
   removing the silicide region from on the gate; and
   forming a second silicide region on the gate.

14. The method of claim 13 and further comprising forming a dielectric layer over the first and second source/drain regions and the gate after reacting the layer but before removing the silicide.

15. The method of claim 14 and further comprising planarizing the dielectric layer wherein the planarizing causes the silicide region to be removed from the gate.

16. The method of claim 15 wherein the planarizing is performed using chemical mechanical polishing.

17. The method of claim 13 wherein the second silicide region has a thickness which is greater than the thickness of the first silicide region.

18. A method of forming a semiconductor device, the method comprising:
   providing a MOS transistor including first and second source/drain regions in a silicon region, the first and second source/drain regions being separated by a channel region, the MOS transistor further including a silicon gate overlying the channel region and insulated therefrom;
   forming silicide regions over the gate and at least one of the source/drain regions;
   removing the silicide region from over the gate; and
   forming a second silicide region on the gate.

19. The method of claim 18 and fuirther comprising forming a dielectric layer over the first and second source/drain regions and the gate after forming silicide regions over the gate and at least one of the source/drain regions but before removing the suicide region from over the gate.

20. The method of claim 19 and further comprising planarizing the dielectric layer wherein the planarizing causes the silicide region to be removed from over the gate.

21. The method of claim 20 wherein the planarizing is performed using chemical mechanical polishing.

22. The method of claim 18 wherein the second silicide region has a thickness which is greater than the thickness of the first silicide region.

23. The method of claim 18 wherein forming silicide regions over the gate and at least one of the source/drain regions comprises forming silicide regions over the gate and both the first and second source/drain regions.

* * * * *

UNITED STATES PATENT AND TRADEMARK OFFICE
CERTIFICATE OF CORRECTION

PATENT NO. : 6,060,387
DATED : May 9, 2000
INVENTOR(S) : Shepela et al.

It is certified that error appears in the above-indentified patent and that said Letters Patent is hereby corrected as shown below:

In the Abstract on the title page
in line 2 change "suicide" to read --silicide--
in line 14 change "suicide" to read --silicide--
In column 5, line 33, insert the word --second-- before "source/drain"

Signed and Sealed this

Twentieth Day of March, 2001

*Attest:*

NICHOLAS P. GODICI

*Attesting Officer*   Acting Director of the United States Patent and Trademark Office